United States Patent
Hung et al.

(10) Patent No.: US 7,469,057 B2
(45) Date of Patent: *Dec. 23, 2008

(54) SYSTEM AND METHOD FOR INSPECTING ERRORS ON A WAFER

(75) Inventors: Chang-Cheng Hung, Hsin-chu (TW);
Hung-Chang Hsieh, Hsinchu (TW);
Hsen-Lin Wu, Hsin-chu (TW);
Tyng-Hao Hsu, Hsin-chu (TW)

(73) Assignee: Taiwan Semiconductor Manufacturing Corp, Hsin-Chu, Taiwan (CN)

( * ) Notice: Subject to any disclaimer, the term of this patent is extended or adjusted under 35 U.S.C. 154(b) by 801 days.

This patent is subject to a terminal disclaimer.

(21) Appl. No.: 10/781,107

(22) Filed: Feb. 18, 2004

(65) Prior Publication Data

US 2004/0165761 A1 Aug. 26, 2004

Related U.S. Application Data

(60) Provisional application No. 60/450,177, filed on Feb. 26, 2003.

(51) Int. Cl.
*G06K 9/00* (2006.01)

(52) U.S. Cl. .................. 382/144; 324/750; 382/149; 382/218; 716/19

(58) Field of Classification Search ............ 250/208.1, 250/559.4; 356/237.1, 237.2, 237.5; 382/144, 382/149, 145

See application file for complete search history.

(56) References Cited

U.S. PATENT DOCUMENTS

| 5,795,688 | A | | 8/1998 | Burdorf et al. |
| 6,040,912 | A | * | 3/2000 | Zika et al. .................... 356/394 |
| 6,205,239 | B1 | * | 3/2001 | Lin et al. .................... 382/149 |
| 6,292,582 | B1 | * | 9/2001 | Lin et al. .................... 382/149 |
| 6,463,184 | B1 | * | 10/2002 | Gould et al. ................ 382/289 |
| 6,509,750 | B1 | * | 1/2003 | Talbot et al. ................ 324/750 |
| 6,566,897 | B2 | * | 5/2003 | Lo et al. ..................... 324/751 |
| 6,691,052 | B1 | * | 2/2004 | Maurer ........................ 702/81 |
| 6,828,542 | B2 | * | 12/2004 | Ye et al. ................... 250/208.1 |
| 6,864,971 | B2 | * | 3/2005 | Lin et al. .................. 356/237.4 |
| 6,865,288 | B1 | * | 3/2005 | Shishido et al. ............. 382/145 |
| 6,906,305 | B2 | * | 6/2005 | Pease et al. ............. 250/208.1 |
| 6,925,202 | B2 | * | 8/2005 | Karklin et al. ............. 382/145 |
| 7,072,502 | B2 | * | 7/2006 | Hemar et al. ............... 382/144 |
| 7,123,356 | B1 | * | 10/2006 | Stokowski et al. ........ 356/237.2 |
| 7,160,650 | B2 | * | 1/2007 | Hechtl et al. .................... 430/5 |
| 7,162,071 | B2 | * | 1/2007 | Hung et al. .................. 382/144 |
| 7,383,530 | B2 | * | 6/2008 | Wang et al. .................... 716/21 |
| 2002/0088952 | A1 | * | 7/2002 | Rao et al. ............. 250/559.45 |
| 2002/0094120 | A1 | * | 7/2002 | Hiroi et al. ................. 382/149 |
| 2004/0179726 | A1 | * | 9/2004 | Burdorf et al. ............. 382/144 |

* cited by examiner

*Primary Examiner*—Gregory M Desire
(74) *Attorney, Agent, or Firm*—Duane Morris, LLP

(57) ABSTRACT

A method and system is disclosed for inspecting defects on a wafer. After acquiring at least one digitized image of at least one portion of a wafer, at least one design database file corresponding to the portion of the wafer is converted into at least one inspection file. After setting one or more error detection thresholds, the digitized image and the inspection file are compared by an inspection tool for detecting defects with regard to the portion of the wafer based on the set error detection thresholds.

20 Claims, 2 Drawing Sheets

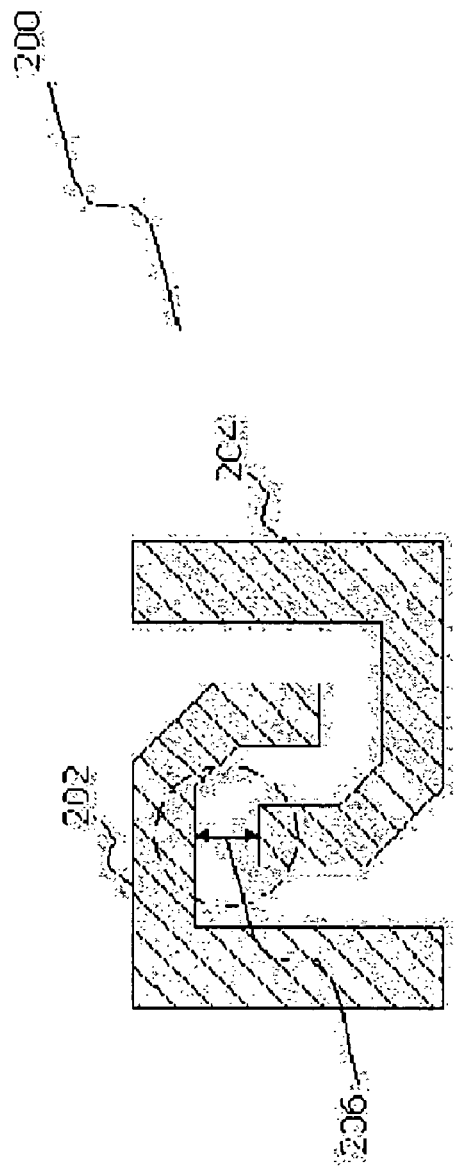
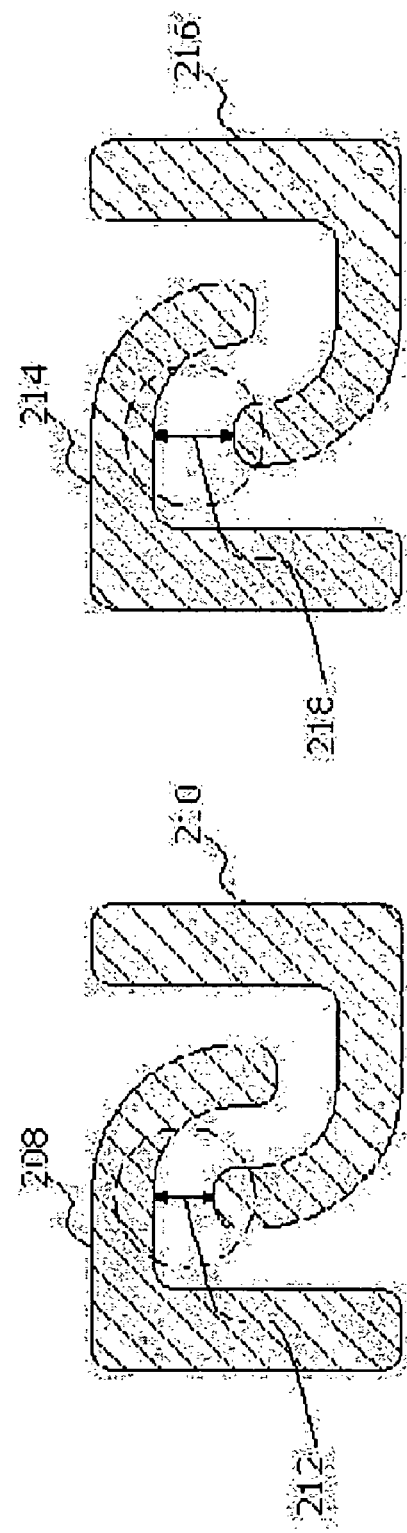
FIG. 2A
FIG. 2B
FIG. 2C

SYSTEM AND METHOD FOR INSPECTING ERRORS ON A WAFER

PRIORITY CLAIM

The present disclosure claims the benefits of U.S. Provisional Patent Application Ser. No. 60/450,177 which was filed on Feb. 26, 2003 entitled Novel Database Inspection Method.

BACKGROUND

The present disclosure relates generally to integrated circuit (IC) manufacturing, and more particularly to inspecting defects in fabricating microelectronic devices through a photolithographic process.

Modern microelectronic devices are commonly produced using a photolithographic process. In this process, a semiconductor wafer is first coated with a layer of photoresist. This photoresist layer is then exposed to illuminating light with a photomask image (for simplicity, the terms photomask, mask, and reticle will be used interchangeably and with equivalency) and subsequently developed. After the development, the patterned photoresist produces an image of the mask on the wafer. Thereafter, the uppermost layer of the wafer is etched, implanted or otherwise processed. Thereafter, the remaining photoresist is stripped. For multilayer wafers, the above procedure is then repeated to produce subsequent patterned layers.

The semiconductor manufacturing is a highly cost competitive industry and there is constant pressure for manufacturers to decrease die cost while increasing functionality. To that end, the use of increasingly sophisticated and higher resolution photolithography tools is required to propel the downward drive in circuit feature size. The major limitations on the resolution of the image that can be projected on the photoresist are created by the light diffraction effects in the optical train from the illuminator optics through the mask/pellicle assembly then through the stepper reduction optics and finally onto the surface of the photoresist. The mask design and mask manufacturing limitations, which impact the quality of the mask, also limit the final resolution achievable by photolithography exposure system. The diffraction effects become increasingly important as the wavelength of the electromagnetic radiation used in the exposure of the photoresist becomes significant with respect to the feature size on the mask utilized during the exposure of the photoresist. Increasing the achievable resolution, thereby decreasing the size of the reproducible features of the projected images, may be accomplished by decreasing the wavelength of the light that is used in the photoresist exposure. For this reason, it is advantageous to use electromagnetic radiation in the ultraviolet region with increasingly smaller wavelengths. Particularly, ultraviolet i-line (365 nm), deep UV (248 nm), and 193 nm have been used. Another method for increasing the resolution of the image is the use of RET (Resolution Enhancement Techniques) which include: off axis illumination, OPC (Optical Proximity Correction) reticles, and PSM (Phase Shift Mask) reticles.

Looking more closely at the OPC method, the layout of the design of the mask is altered in such a way that the mask produces a higher resolution image on the photoresist. Optical proximity corrections introduced into the mask design compensate for the optical proximity effects caused by the limited resolution of the optical exposure system used in the photolithographic process. An reduction optical stepper is one example of an optical exposure system. Other types of optical exposure systems include optical scanners and step-and-scan exposure systems. The most common optical proximity effects include corner rounding, line end shortening, and line width non-linearity. Photomask manufacturing limitations, including mask etching, also contributes to the proximity effects. To correct for the proximity effects such as corner rounding, reentrant and outside serifs are added to the mask design. To correct for line width variations, so called sub-resolution features are utilized in the mask layout.

In order to facilitate the evaluation of the mask performance at the wafer level, tools have been developed that are able to scan a photomask and yield an aerial image of the mask as it would appear at the wafer plane. According to this method, the mask inspection system replicates an optical exposure tool's critical parameters used during the exposure of the photoresist during semiconductor device fabrication. The mask inspection device then applies a set, or a plurality of sets, of exposure conditions that may be used in the actual photolithographic process to create an aerial image, or plurality of images, from the mask. In particular, these systems match the wavelength, the partial coherence of the exposure light, illumination aperture and the imaging numerical aperture (NA) of the optical exposure system. The created aerial image is typically magnified and detected using a CCD camera that is sensitive to the ultraviolet radiation. The acquired aerial images are analyzed using software algorithms developed for defect identification.

The current photomask inspection procedures fall short in the inspection process in that the actual circuit image produced on the semiconductor wafer from the photomask has not been verified directly back to the design layout. Accordingly, there is a need for an inspection system that would make it possible to detect line width errors in the image that the mask would actually produce on the semiconductor wafer. It also is desirable for the mask inspection system to provide speedy and reliable identification of the above mentioned mask defects.

SUMMARY

A method and system are disclosed for inspecting defects in a wafer. According to one example of the present disclosure, after acquiring at least one digitized image of at least one portion of a wafer, at least one design database file corresponding to the portion of the wafer is converted into at least one inspection file. After setting one or more error detection thresholds, the digitized image and the inspection file are compared by an inspection tool for detecting defects with regard to the portion of the wafer based on the set error detection thresholds. The errors detected include mask patterning induced errors or differences, wafer process induced errors, and circuit layout errors or even inappropriate version errors.

These and other aspects and advantages will become apparent from the following detailed description, taken in conjunction with the accompanying drawings, illustrating by way of example the principles of the disclosure.

BRIEF DESCRIPTION OF THE DRAWINGS

FIGS. 2A-2C provide an example for detecting errors using the disclosed method and system.

DESCRIPTION

Figure 1:
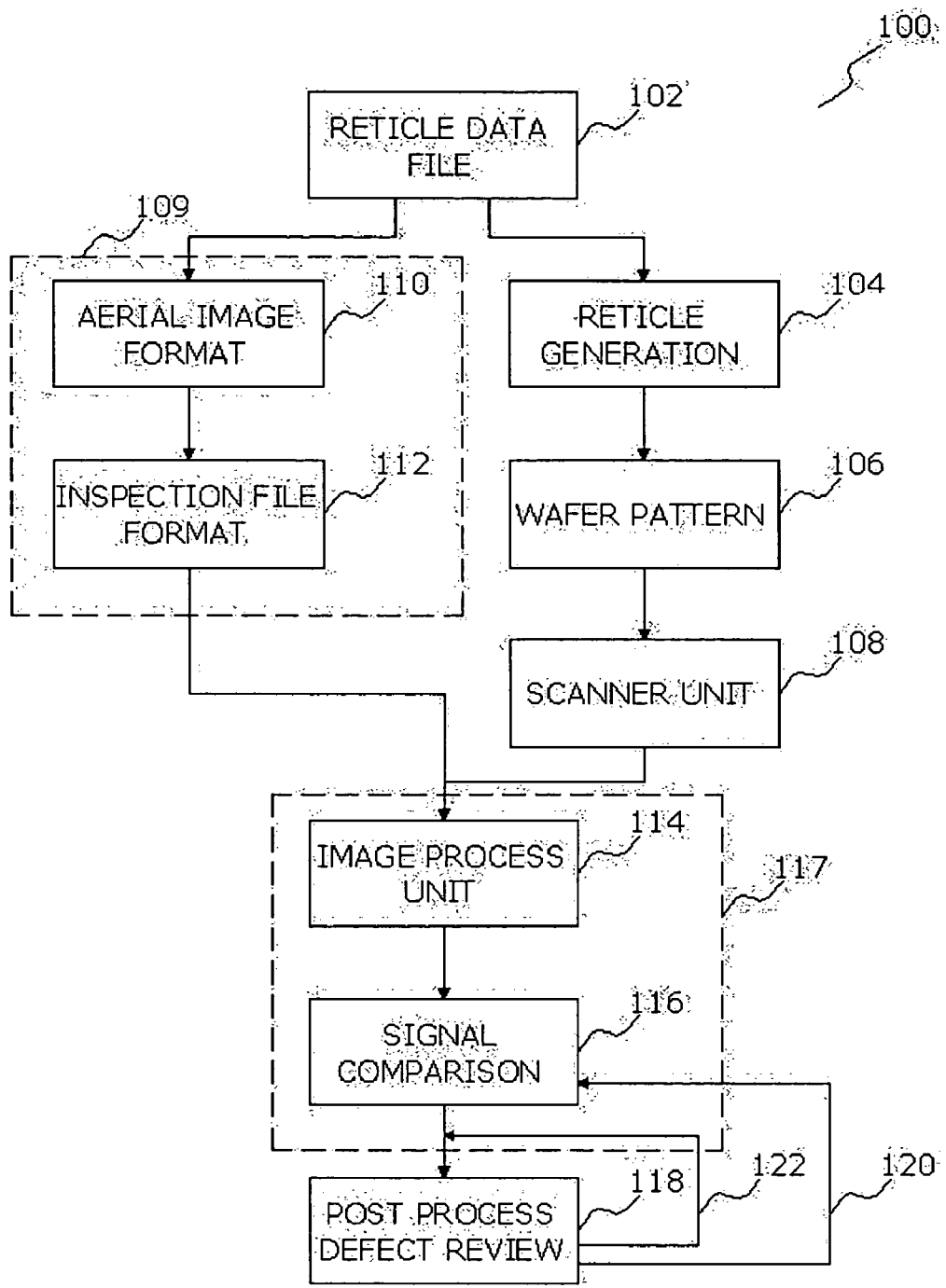
FIG. 1 shows a block diagram of a wafer inspection system according to one embodiment.

A method and system are disclosed for performing an automatic wafer inspection to detect printable defects that would cause flaws in semiconductor die. As will be described below, the present disclosure provides an inspection system capable of detecting defects in the image that the photomask actually prints on a semiconductor wafer, including other mask defects such as surface defects or pin holes in border regions surrounding the photomask pattern. For the purpose of this application, the terms "reticle", "mask", and "photomask" may be used interchangeably.

FIG. 1 shows a block diagram 100 illustrating the operation of a wafer inspection system according to an embodiment of the invention. In this embodiment, a design database file such as a reticle data file, 102, is used to generate a reticle on a reticle writing tool such as, but not limited to, a laser writing tool or an e-beam writing tool. The reticle data file may include advanced reticle enhancement techniques (RET) such as OPC or phase shift as well as process bias for the reticle manufacturing tool set. During a reticle generation process 104, the reticle data file is written on the surface of a resist coated photomask, developed, etched, cleaned, then inspected. The reticle generated in 104 is then used for patterning features on one or more semiconductor wafers. Individuals skilled in the art will appreciate that wafers may be patterned with a plurality exposure tool settings including, but not limited to exposure, focus, numerical aperture, partial coherence, and illuminator setting. Similarly, it will also be appreciated that a plurality of process changes may be applied to the semiconductor wafers before and after exposure to further evaluate a process window for a reticle design or RET. Such processing related variables may include photoresist types, anti-reflective materials, film thickness of antireflective or photoresist materials, the pre-exposure bake process, the post- exposure bake process, image development process and process chemistry employed to create the image on a wafer, 106. The plurality of exposure tool settings combined with the plurality of process changes possible will collectively be called variables henceforth. A plurality of wafers may be prepared and used to qualify a reticle utilizing the invention. A fixed variable set may be applied to each wafer patterned, or a plurality of variable changes may be applied to each wafer.

The wafer inspection system according to the present disclosure may include four main modules: (1) a wafer scanning unit 108; (2) a data format converter 109, including an aerial image simulator module 110, and an inspection file format conversion module 112; (3) an image filtering and comparison module 117, comprised of an image processing unit 114, and a signal comparison unit 116; and (4) a post process defect review station 118. As anyone skilled in the art would appreciate, these modules, or functions of the modules may be combined or divided without changing the function of the invention.

Scanner Unit

The scanner unit, 108, scans the wafer pattern and digitizes wafer pattern images based on the features on the wafer created by the photomask. In one embodiment, the wafer pattern image may be stored in memory for later analysis, in another embodiment, the wafer pattern image may be analyzed in real-time while acquiring the wafer pattern images. In yet another embodiment, the scanner may be programmed to scan selected die, all die, or only defined areas of selected die depending on variables applied to the wafer or for data management and processing purposes. The scanner imaging optics may be based on e-beam technology. Still another embodiment of the scanner imaging optics may employ confocal imaging capability, or both.

Data Format Converter

The data format converter module 109, creates the simulated aerial image 110, which is generated from a design database file such as the reticle data file used to build the photomask. If a portion of the wafer is scanned, only one or more corresponding design database files associated with the portion of the wafer is selected. This simulated aerial image is then converted into an inspection file, 112, which has a format which facilitates rapid comparison to the wafer pattern image generated by the scanner unit. A feature of the data format converter module is the capability to select all wafer areas or only selected areas of the wafer for conversion to an inspection file to enable faster processing time through the converter module. It is further understood that the design database file can be processed with OPC features so that the inspection file matches closely with the final features on the wafer. The data format converter module is software based and preferably operates on a computer workstation utilizing an advanced graphical interface. The data format converter module may create files specific to one particular inspection tool, but may also create files of a standard format that may be used by multiple inspection tools.

Image Filtering and Comparison Module

Both the aerial image inspection file and the wafer pattern image data from the scanner unit are transferred to the image filtering and comparison module 117. The module 117 is also software based and preferably operates on a computer work station to perform predetermined processing algorithms using the image files or data input from the scanner unit 108 and from the format converter 109. It then transfers the processed images to the signal comparison unit 116 which identifies the discrepancies and differences between the semiconductor features as represented by the wafer image files and the design as represented by the design database file. These results are then sent to the post process defect review station for analysis.

Post Process Defect Review

Preferably, the inspection system results will yield clean data, free of false defects, for rapid analysis and mask disposition. In addition to actual defects, false defects are discrepancies which may develop between the simulated aerial image file and the actual wafer image file caused not by the presence of actual defects, but by exposure tool limitations or process drift. If false defects are detected at the post process review station, the operator may apply selective bias parameters to correct for systematic image differences between the converted aerial image data file and the wafer image data. This can be done by setting one or more bias parameters so that false defects are avoided. A new signal comparison is performed with the applied selective bias parameters. It is understood that this bias fitting process can by applied to either the digitized wafer image file or the converted inspection file. The post process defect review may be conducted again. There may be further differences between the compared data files after the application of systematic bias parameters. In this case, the operator of the inspection system may apply certain error detection thresholds to the signal comparison unit 116 to eliminate any remaining false defects. The processes of setting and applying the bias parameters and error detection thresholds may be performed in multiple rounds as the situation warrants.

It will be readily appreciated that this example of a reticle inspection system described above may be used to qualify new reticles for use in established process lines. A plurality of wafer images may be acquired by the scanner unit from a single reticle under a plurality of process variables may be used for improving a wafer process window for yield or throughput enhancement. It is also readily appreciated that selective images taken by the scanner from semiconductor wafers may be used for process control such as critical dimension measurement of features in the device circuit. Preferably, the post defect review station is software based and operates on a computer work station configured to graphically or numerically display data based on a user's data analysis preferences.

Referring to FIGS. 2A-2C, illustrated is an image of a portion of a circuit 200 whose defects may be detected according to one example of the invention. In this example, two different photomask writing tools are evaluated for their capability to produce OPC reticles. The technique described herein is then used to inspect the photomask images produced on the semiconductor wafer for defects. One writing tool may be an optical laser photomask writer, the other tool may be an E-beam photomask writer. The difference in image fidelity between the two photomasks generated on different writing tools may not be discernable by conventional direct mask inspection, or from an aerial image of the mask.

Referring to FIG. 2A, features of a semiconductor mask design are generally designated at 202 and 204. Features 202 and 204 form part of a binary mask layout. The numeral 206 identifies a critical distance in the binary mask layout between 202 and 204. From this layout, features on an advanced mask design are generated with reticle enhancement techniques (RET) such as with OPC, or phase shift. These features may be then used to generate corresponding features on two different advanced photomasks utilizing an e-beam writing tool and a laser writing tool. Then, after photomask fabrication, photomask inspection and pattern transfer to semiconductor wafers, the respective wafer images from the writing tools are illustrated in FIGS. 2B and 2C.

Turning to FIG. 2B, features 208, 210, and 212 are the corresponding features of 202, 204 and 206 as they actually appear on a patterned wafer generated by an e-beam written mask. To those skilled in the art, it is understood that wafer yield, hence profit, depends on the ability to predictably define images on the wafer surface which closely replicate the modeled circuit design. To illustrate this, a critical design dimension and tolerance from certain device design rules may be specified at location 206 on the binary mask layout between features 202 and 204. After photomask fabrication, photomask inspection and pattern transfer to the semiconductor wafer, the corresponding critical design dimension on the wafer, location 212, is inspected and found to meet the required design specification. With the use of the bias parameters and error detection thresholds, there may not be any mask error enhancement factor (MEEF) found.

Turning now to FIG. 2C, features 214, 216, and 218 are the corresponding features of 202, 204 and 206 as they actually appear on a patterned wafer generated by a laser written mask. Utilizing the same critical design dimension and tolerances from the device design rules specified at location 206 on the binary mask layout, corresponding location 218 is found to fail the design criteria. In this example, a line end shortening is displayed which will lead to device anomalies such as yield degradation or reliability problems in the chips manufactured from this mask. The above described method not only helps to detect the defects, it also provides a way to identify which reticle writing tool is the better one to use.

To implement the above features and achieve the advantages of the present disclosure, there is provided a method for inspecting a plurality of photomask types such as single die reticles, multi-die reticles, or 1×projection masks which may be fabricated with a plurality of manufacturing techniques such as, but not limited to, binary chrome/glass without RET, binary masks with RET, chromeless phase shift lithography (CPL) masks, X-ray projection masks, or ion beam projection masks.

The method described above can largely be applied to detect mask patterning induced errors or differences, wafer process induced errors, and circuit layout errors or even inappropriate version errors. The mask patterning induced error includes any discrepancies introduced during the mask making process. As described above, the use of different reticle writers may cause differences in the resultant masks. Other possible sources for introducing such errors includes mask shops, mask blank substrate, mask baking facility, mask etcher, etc. The comparison results may also provide proximity trend in addition to errors.

The wafer process induced errors include any errors introduced during semiconductor processing for making circuit features on the wafer by using the masks. The errors may include various defects including critical dimension errors. The detected comparison result may also provide indication of critical dimension uniformity issues. The detected defects may also help to remedy circuit layout errors, and help to re-design circuit layouts. In short, the present disclosure provides effective methods for indicating how the final and actual products will be as opposed to the expected ones, thereby providing a more effective way of minimizing errors in the manufacturing.

The above disclosure provides many different embodiments, or examples, for implementing different features of the invention. Specific examples of components, and processes are described to help clarify the invention. These are, of course, merely examples and are not intended to limit the invention from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A method for inspecting defects in a wafer, the method comprising:
    acquiring at least one digitized image of at least one actual feature on the wafer taken directly from the wafer;
    converting at least one design database file corresponding to the feature of the wafer into at least one inspection file;
    setting one or more error detection thresholds;
    comparing the digitized image and the inspection file by an inspection tool for detecting defects with regard to the feature of the wafer based on the set error detection thresholds; and
    selectively applying bias parameters to one of either the digitized image or inspection file when false defects are detected at a post process review station between the digitized image and inspection file.

2. The method of claim 1 wherein the design database file is processed with optical proximity correction features.

3. The method of claim 1 wherein the converting further includes converting the design database file to an aerial image format.

4. method of claim 3 further comprising converting the database file from the aerial image format to an inspection file format.

5. The method of claim 1 wherein a false defect is detected that is caused by one of either exposure tool limitations or process drift.

6. The method of claim 1 further comprising detecting a proximity trend with the portion of the wafer.

7. The method of claim 1 wherein the defects include mask patterning induced defects.

8. The method of claim 1 wherein the defects include wafer processing induced defects.

9. The method of claim 1 wherein the defects include circuit layout induced defects.

10. A method for inspecting mask patterning process induced defects in a wafer, the method comprising:
acquiring at least one digitized image of at least one actual feature on the wafer taken directly from the wafer;
converting at least one mask database file for a mask corresponding to the feature into at least one inspection file specific to an inspection tool through an aerial image based processing;
comparing the digitized image and the inspection file by the inspection tool;
detecting disallowed mask patterning process induced defects by examining differences;
selectively applying bias parameters to one of either the digitized image or inspection file when false defects are detected at a post process review station between the digitized image and inspection file; and
comparing the digitized image and the inspection file by the inspection tool a second time with the applied selective bias parameters when false defects are detected.

11. The method of claim 10 wherein the detecting further includes detecting defects induced by one or more processes using the mask.

12. The method of claim 10 wherein the detecting further includes detecting defects induced by a mask writer while making the mask.

13. The method of claim 10 wherein the detecting further includes detecting defects induced by a mask blank substrate.

14. The method of claim 10 wherein the detecting further includes detecting proximity trends of the mask pattern.

15. A method for inspecting wafer processing induced defects for making a semiconductor device, the method comprising:
acquiring at least one digitized image of at least one actual feature on the wafer taken directly from the wafer;
converting at least one design database file corresponding to the feature into at least one inspection file specific to an inspection tool through an aerial image based processing;
comparing the digitized image and the inspection file by the inspection tool;
detecting disallowed wafer processing induced defects by examining differences between the inspection file and the digitized image corresponding to the feature;
selectively applying bias parameters to one of either the digitized image or inspection file when false defects are detected at a post process review station between the digitized image and inspection file; and
comparing the digitized image and the inspection file by the inspection tool a second time with the applied selective bias parameters when false defects are detected.

16. The method of claim 15 wherein the defects includes critical dimension errors.

17. The method of claim 15 further includes information about critical dimension distribution.

18. The method of claim 15 wherein a false defect is detected that is caused by one of either exposure tool limitations or process drift.

19. The method of claim 15 wherein the detecting further includes setting on or more error detection thresholds for avoiding false defects.

20. A method for inspecting circuit layout related defects for making a semiconductor device, the method comprising:
acquiring at least one digitized image of at least one actual circuit feature on the wafer taken directly from the wafer;
converting at least one circuit design database file corresponding to the feature based on one circuit layout design into at least one inspection file through an aerial image based processing;
comparing the digitized image and the inspection file by the inspection tool;
detecting disallowed circuit layout related defects by examining differences thereof;
selectively applying bias parameters to one of either the digitized image or inspection file when false defects are detected at a post process review station between the digitized image and inspection file; and
comparing the digitized image and the inspection file by the inspection tool a second time with the applied selective bias parameters when false defects are detected.

* * * * *

UNITED STATES PATENT AND TRADEMARK OFFICE
CERTIFICATE OF CORRECTION

| | |
|---|---|
| PATENT NO. | : 7,469,057 B2 |
| APPLICATION NO. | : 10/781107 |
| DATED | : December 23, 2008 |
| INVENTOR(S) | : Chang-Cheng Hung et al. |

It is certified that error appears in the above-identified patent and that said Letters Patent is hereby corrected as shown below:

Column 7, line 4, add before method "The".

Signed and Sealed this

Twenty-sixth Day of May, 2009

JOHN DOLL
*Acting Director of the United States Patent and Trademark Office*